(12) United States Patent
Kirchgessner

(10) Patent No.: US 7,084,485 B2
(45) Date of Patent: Aug. 1, 2006

(54) METHOD OF MANUFACTURING A SEMICONDUCTOR COMPONENT, AND SEMICONDUCTOR COMPONENT FORMED THEREBY

(75) Inventor: James A. Kirchgessner, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 108 days.

(21) Appl. No.: 10/750,125

(22) Filed: Dec. 31, 2003

(65) Prior Publication Data

US 2005/0145951 A1 Jul. 7, 2005

(51) Int. Cl.
*H01L 27/082* (2006.01)
*H01L 27/102* (2006.01)
*H01L 29/70* (2006.01)
*H01L 31/11* (2006.01)

(52) U.S. Cl. ............... 257/577; 257/559; 257/582; 438/325; 438/329; 438/330

(58) Field of Classification Search ........... 257/557, 257/559, 566, 572, 574, 577, 582; 438/203, 438/205, 213, 313, 316, 322, 323, 325, 328, 438/329, 330, 335

See application file for complete search history.

(56) References Cited

U.S. PATENT DOCUMENTS

| | | | | | |
|---|---|---|---|---|---|
| 5,465,006 | A | * | 11/1995 | Chen | 257/557 |
| 5,569,613 | A | * | 10/1996 | Yang | 438/350 |
| 6,239,477 | B1 | * | 5/2001 | Johnson | 257/592 |
| 6,472,753 | B1 | * | 10/2002 | Kondo et al. | 257/758 |
| 6,476,450 | B1 | * | 11/2002 | Kondo et al. | 257/370 |
| 6,815,822 | B1 | * | 11/2004 | Kondo et al. | 257/758 |

* cited by examiner

*Primary Examiner*—Nathan J. Flynn
*Assistant Examiner*—Victor A. Mandala, Jr.
(74) *Attorney, Agent, or Firm*—Bryan Cave LLP

(57) ABSTRACT

A method of manufacturing a semiconductor component includes: providing a semiconductor substrate (210, 510); forming a trench (130, 430) in the semiconductor substrate to define a plurality of active areas separated from each other by the trench; forming a buried layer (240, 750) in the semiconductor substrate underneath a portion of the trench, where the buried layer is at least partially contiguous with the trench; after forming the buried layer, depositing an electrically insulating material (133, 810) in the trench; forming a collector region (150, 950) in one of the plurality of active areas, where the collector region forms a contact to the buried layer; forming a base structure over the one of the plurality of active areas; and forming an emitter region over the one of the plurality of active areas.

21 Claims, 7 Drawing Sheets

US 7,084,485 B2

METHOD OF MANUFACTURING A SEMICONDUCTOR COMPONENT, AND SEMICONDUCTOR COMPONENT FORMED THEREBY

FIELD OF THE INVENTION

This invention relates generally to semiconductor components, and relates more particularly to buried layers in semiconductor components.

BACKGROUND OF THE INVENTION

Parasitic extrinsic collector resistance ($R_{cx}$) can significantly limit the performance of high-performance bipolar or bipolar and complementary metal-oxide-semiconductor (BiCMOS) devices such as silicon-germanium (SiGe) Heterojunction Bipolar Transistors (HBTs). In an attempt to limit $R_{cx}$ in a SiGe HBT or other device, a highly-doped N-type (N+) buried layer in conjunction with an epitaxial silicon layer has conventionally been used to form a very low resistance region below the surface of the SiGe HBT or other device, thereby reducing the lateral component of $R_{cx}$. This conventional buried layer/epitaxial layer approach is described in more detail in U.S. Pat. No. 5,061,646, which patent is hereby incorporated herein by reference.

Due to the depth and thickness of the N+ buried layers used, the addition of deep trench isolation structures to the SiGe HBT or other device is typically required in order to limit the parasitic collector-substrate capacitance of the SiGe HBT or other device to acceptable levels. Therefore, the conventional buried layer approach used to limit $R_{cx}$ can add considerable complexity and expense to the overall manufacturing process of the SiGe HBT or other device. Accordingly, a need exists for a method of limiting $R_{cx}$ in a SiGe HBT or other device without requiring the expense and complexity necessitated by a conventional buried layer.

BRIEF DESCRIPTION OF THE DRAWINGS

The invention will be better understood from a reading of the following detailed description, taken in conjunction with the accompanying figures in the drawings in which.

Figure 1:
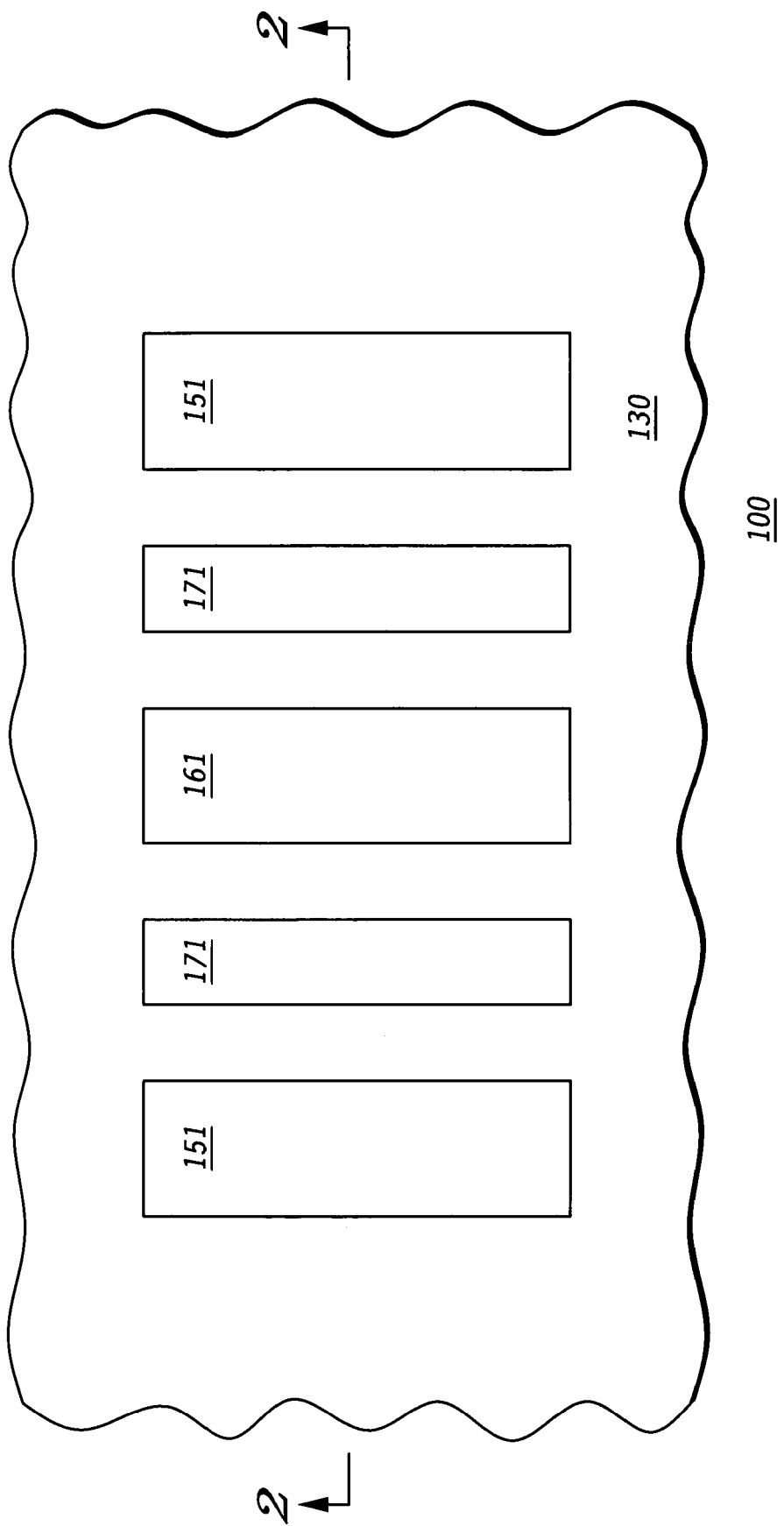
FIG. 1 is a top view of a portion of a semiconductor component according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a method of manufacturing a semiconductor component comprises: providing a semiconductor substrate having a surface and a first conductivity type; forming a trench in the surface of the semiconductor substrate to define a plurality of active areas separated from each other by the trench; forming a buried layer in the semiconductor substrate underneath a portion of the trench, where the buried layer has the second conductivity type and is at least partially contiguous with the trench; after forming the buried layer, depositing an electrically insulating material in the trench; forming a collector region having the second conductivity type in one of the plurality of active areas, where the collector region forms a contact to the buried layer; forming a base structure having the first conductivity type over the one of the plurality of active areas; and forming an emitter region having the second conductivity type over the one of the plurality of active areas.

In another embodiment of the invention, a method of manufacturing a semiconductor component comprises: providing a semiconductor substrate having a surface and a first conductivity type, where the semiconductor substrate comprises a plurality of bipolar semiconductor regions and a plurality of CMOS regions; forming a trench in the surface of the semiconductor substrate in the plurality of bipolar semiconductor regions and in the plurality of CMOS regions to define a plurality of active areas separated from each other by the trench; forming a buried layer in the semiconductor substrate underneath a portion of the trench in the plurality of bipolar semiconductor regions, where the buried layer has the second conductivity type and is at least partially contiguous with the trench; after forming the buried layer, depositing an electrically insulating material in the trench; forming a collector region having the second conductivity type in each one of the plurality of bipolar semiconductor regions, where the collector region forms a contact to the buried layer; forming a base structure having the first conductivity type over each one of the plurality of bipolar semiconductor regions; forming an emitter having the second conductivity type over each one of the plurality of bipolar semiconductor regions; forming source/drain regions over each one of the plurality of CMOS regions; and forming a gate region over each one of the plurality of CMOS regions.

Figure 2:
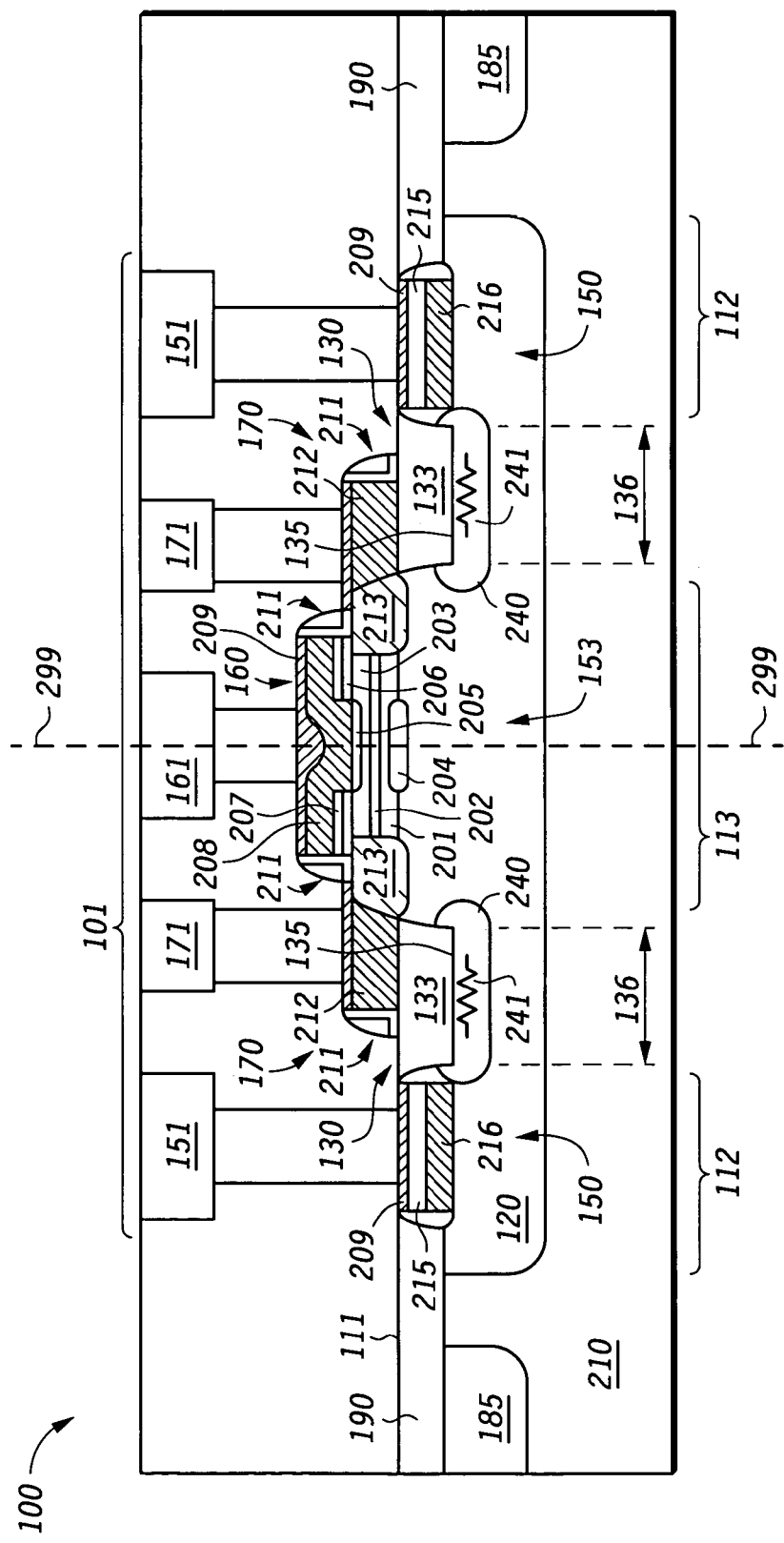
FIG. 2 is a cross-sectional view of the portion of the semiconductor component of FIG. 1, taken along a section line 2—2 in FIG. 1.

FIG. 1 is a top view of a portion of a semiconductor component 100 according to an embodiment of the invention. FIG. 2 is a cross-sectional view of the portion of semiconductor component 100 of FIG. 1, taken along a section line 2—2 in FIG. 1.

Referring now to FIGS. 1 and 2, semiconductor component 100 comprises a semiconductor substrate 210 having a surface 111, a semiconductor region 120 in semiconductor substrate 210, a trench 130 in surface 111 of semiconductor substrate 210, a buried layer 240 underneath and at least partially contiguous with trench 130, a collector region 150 in semiconductor substrate 210, and an emitter region 160 above semiconductor substrate 210. Semiconductor region 120, trench 130, buried layer 240, collector region 150, and emitter region 160 form portions of a semiconductor device 101. In one embodiment, semiconductor device 101 is a bipolar semiconductor device. Semiconductor component 100 may further comprise additional semiconductor devices, not illustrated in FIGS. 1 and 2, including complimentary metal-oxide semiconductor (CMOS) devices, and/or additional bipolar semiconductor devices. In at least one embodiment, the bipolar semiconductor devices and the CMOS semiconductor devices can be formed simultaneously.

Collector region 150 comprises a collector electrode 151, and emitter region 160 comprises an emitter electrode 161. Semiconductor substrate 210 has a first conductivity type, and semiconductor region 120, buried layer 240, collector region 150, and emitter region 160 have a second conductivity type. As an example, the first conductivity type can be, and semiconductor substrate 210 can have, a P-type conductivity, and the second conductivity type can be, and semiconductor region 120, buried layer 240, collector region 150, and emitter region 160 can have, an N-type conductivity. As a further example, buried layer 240 can be a heavily-doped N+ sub-isolation buried layer, so-named because of its location underneath and at least partially contiguous with a portion of trench 130. In one embodiment, buried layer 240 is contained in semiconductor region 120, and does not extend below semiconductor region 120. In another embodiment, buried layer 240 is not contained entirely within semiconductor region 120. In both embodiments, buried layer 240 and semiconductor region 120 at least partially overlap.

As an example, collector region 150 may have a first resistivity, and buried layer 240 may have a second resistivity. Because buried layer 240 is a heavily-doped buried layer, the second resistivity is less than the first resistivity. The presence of buried layer 240 underneath and at least partially contiguous with a portion of trench 130 lowers a lateral component 241 of $R_{cx}$ in semiconductor device 101. In certain embodiments, buried layer 240 can reduce lateral component 241 of $R_{cx}$ in semiconductor device 101 to a level comparable to that achieved with a traditional deep N+ buried layer, a result that is especially beneficial in semiconductor devices having peak cutoff frequencies above approximately 50 gigahertz (GHz). For example, a high frequency semiconductor device may have a peak cutoff frequency ($f_T$) of approximately 50 GHz with a lateral collector resistance of approximately 300 ohms per square (ohms/square), and a peak cutoff frequency exceeding approximately 100 GHz at a collector resistance of approximately 30 ohms/square. As stated above, a sub-isolation buried layer such as buried layer 240 is desirable because it is both less expensive and less complex to manufacture than a traditional deep N+ buried layer.

After certain manufacturing steps have been performed, trench 130 may be at least partially filled with an electrically insulating material 133. As an example, electrically insulating material 133 can comprise tetra-ethyl-ortho-silicate (TEOS). A method of manufacturing semiconductor component 100 according to an embodiment of the invention will be discussed below. Trench 130 comprises a portion 135 having a length 136. In one embodiment, buried layer, 240 extends at least along all of length 136. In other words, in that embodiment, a length of buried layer 240 is at least as great as length 136 of portion 135 of trench 130. In another embodiment, buried layer 240 extends along less than all of length 136.

Semiconductor substrate 210 comprises a portion 112 and a portion 113. Collector region 150 is in portion 112 of semiconductor substrate 210, and emitter region 160 is above portion 113 of semiconductor substrate 210.

Semiconductor device 101 further comprises un-doped silicon epitaxial layer 201 and silicon epitaxial layer 203 having the first conductivity type, a silicon-germanium epitaxial layer 202 having the first conductivity type, a selectively implanted collector region 204 having the second conductivity type located in silicon epitaxial layer 201 and semiconductor substrate 210, an emitter diffusion 205 having the second conductivity type located in silicon epitaxial layer 203, a dielectric layer 206, a silicon cap layer 207, an emitter 208 having the second conductivity type, silicide layers 209, spacer structures 211, a base contact 212 having the first conductivity type, and an extrinsic base region 213 having the first conductivity type. Semiconductor device 101 still further comprises source/drain regions 215 having the second conductivity type, and a resistor implant 216.

As an example, dielectric layer 206 can be an oxide or a nitride layer, or may comprise some other dielectric material or combination of dielectric materials. As a further example, the oxide layer can consist substantially of silicon dioxide that is thermally grown in an oxidation furnace or that is deposited by a chemical vapor deposition process. As other examples, the oxide layer can consist substantially of TEOS or phosphosilicate glass that is deposited by a chemical vapor deposition process, or the oxide layer can consist substantially of silicon oxy-nitride that is also deposited by a chemical vapor deposition process. Furthermore, the oxide layer can comprise a high dielectric constant material such as, for example, hafnium oxide. A nitride layer, as an example, can consist substantially of silicon nitride that is deposited by a chemical vapor deposition process. As another example, a nitride layer can consist substantially of silicon oxy-nitride that is also deposited by a chemical vapor deposition process. As still other examples, emitter 208 can comprise polysilicon or polysilicon doped with arsenic or phosphorus; silicide layers 209 can comprise a silicide such as, for example, cobalt silicide ($CoSi_2$) or titanium silicide ($TiSi_2$); and resistor implant 216 can be doped with phosphorus or arsenic.

As still another example, extrinsic base region 213 may be formed by an implant into silicon epitaxial layers 201 and 203, silicon-germanium epitaxial layer 202, and semiconductor substrate 210 that is self-aligned to an edge of emitter 208. Extrinsic base region 213 may reduce the resistance between base contacts 212 and silicon-germanium epitaxial layer 202. As a still further example, silicon-germanium epitaxial layer 202 may further comprise boron or another dopant.

Semiconductor component 100 is symmetric about a vertical line 299 drawn through a middle of emitter region 160. Semiconductor component 100 further comprises a base region 170 having a base electrode 171, a spacer structure 211, and base contact 212. Semiconductor component 100 still further comprises a well 185 and a trench 190. Trench 190 is filled with an oxide or other dielectric material. In one embodiment, well 185 has the first conductivity type, and base contacts 212 have the second conductivity type.

Figure 3:
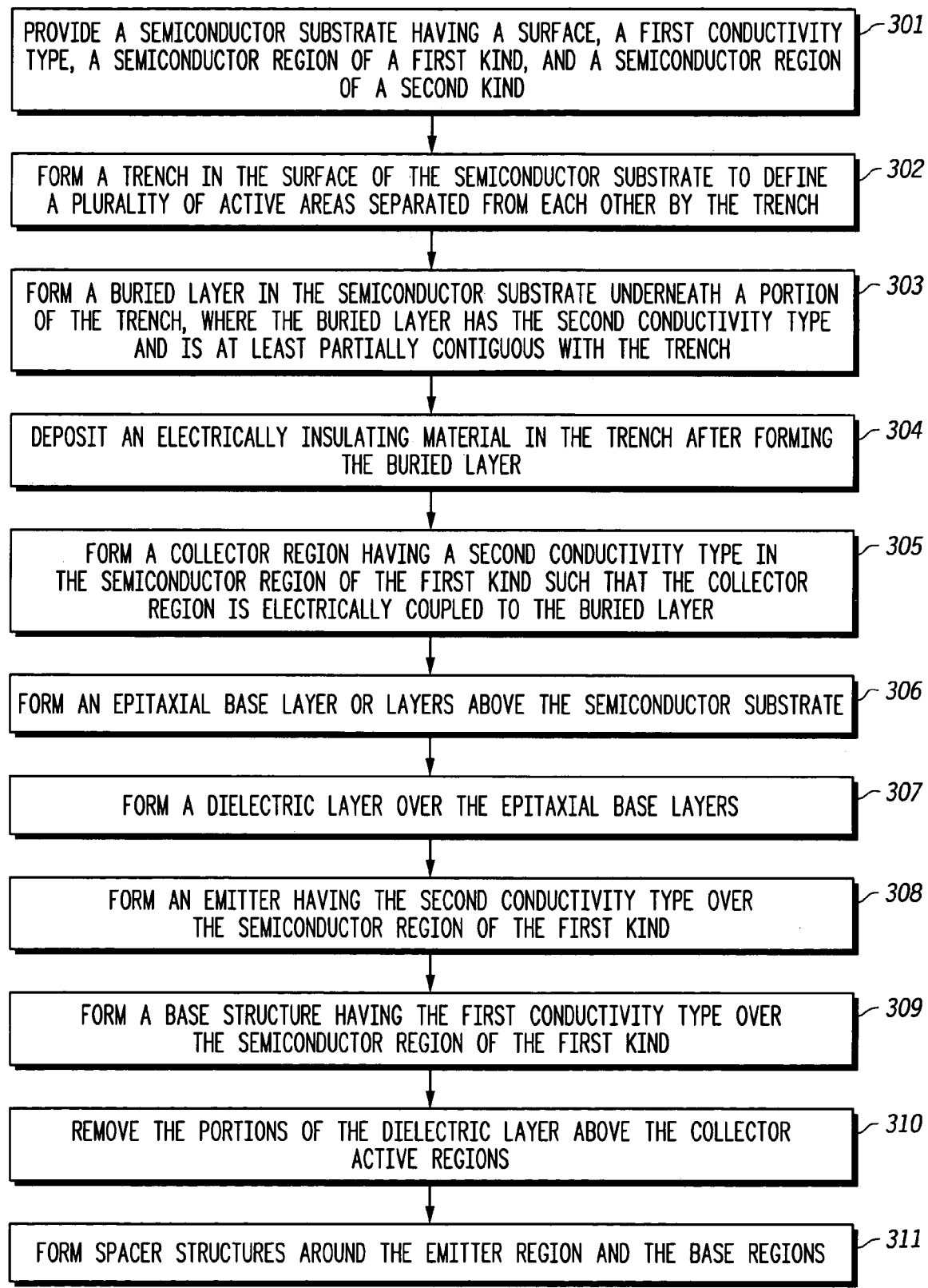
FIG. 3 is a flow chart illustrating a method of manufacturing a semiconductor component according to an embodiment of the invention.

FIG. 3 is a flow chart illustrating a method 300 of manufacturing a semiconductor component according to an embodiment of the invention. In method 300, layer thicknesses and doping concentrations are provided in accordance with well-known parameters and values, and will not be further described herein. A step 301 of method 300 is to provide a semiconductor substrate having a surface, a first conductivity type, a semiconductor region of a first kind, and a semiconductor region of a second kind. As an example, the semiconductor substrate can be similar to semiconductor substrate 210 in FIG. 2. As another example, the surface of the semiconductor substrate can be similar to surface 111 in FIG. 2. As still another example, the semiconductor region of the first kind can be similar to bipolar semiconductor region 410, first shown and described in connection with FIG. 4 hereinafter, and the semiconductor region of the second kind can be similar to CMOS region 420, also first shown and described in connection with FIG. 4 hereinafter.

A step 302 of method 300 is to form a trench in the surface of the semiconductor substrate to define a plurality of active areas separated from each other by the trench. The trench can be formed in accordance with trench formation techniques, as known in the art. As an example, the trench can be similar to trench 130 in FIGS. 1 and 2. In at least one embodiment, bipolar devices and CMOS devices may be formed simultaneously within the semiconductor component. For example, step 302 can also be used to form trenches for bipolar and/or CMOS devices in the semiconductor components.

A step 303 of method 300 is to form a buried layer in the semiconductor substrate underneath a portion of the trench, where the buried layer has the second conductivity type and is at least partially contiguous with the trench. As an example, the buried layer can be similar to buried layer 240 in FIG. 2. In one embodiment, step 303 can comprise implanting a dopant through the trench. As an example, the dopant can have the second conductivity type. In the same or another embodiment, step 303 can comprise forming a plurality of buried layers, each one of the plurality of buried layers located under a portion of the trench in one of a plurality of bipolar semiconductor regions first mentioned above in connection with step 301. Step 303 can further comprise forming at least one spacer structure in the trench. As an example, the spacer structure can be similar to the spacer structure formed by a portion of nitride layer 730, as shown and described in connection with FIG. 7 below. Step 303 can still further comprise forming an implant mask over at least a portion of the CMOS region, or, if the semiconductor substrate comprises a plurality of CMOS regions, forming an implant mask over one or more of the plurality of CMOS regions. As an example, the implant mask can be similar to implant mask 740 in FIG. 7 below. As a further example, a location or a size of the implant mask can be adjusted in order to alter a parameter of a buried layer formed in a subsequent step. As a particular example, the implant mask can be located and sized so as to control the horizontal boundary of the buried layer within the trench formed previously in step 302.

In the same or another embodiment, step 303 can comprise self-aligning the buried layer to the trench. As it is used herein, the phrase "self-aligning" means self aligning one or more boundaries of the buried layer to an edge of the trench. Step 303 can further comprise annealing the dopant after implanting the dopant and before filling the trench. In another embodiment, the dopant is not annealed before filling the trench, but is annealed during subsequent high-temperature steps performed during the manufacturing process. Step 303 can further comprise removing the spacer structure After forming the buried layer. In another embodiment, the spacer structure can be left in place in the portion of the trench instead of being removed. In the same or another embodiment, a spacer structure can be formed in the trench after forming the buried layer.

Step 303 is referred to herein as a buried layer module. More specifically, the buried layer module can comprise: forming a buried layer in the semiconductor substrate; optionally forming at least one spacer structure in the trench; forming an implant mask over the CMOS region(s); optionally self-aligning the buried layer to the trench; optionally annealing the dopant after implanting the dopant and before filling the trench; and optionally removing the spacer structure after, forming the buried layer. The buried layer module is transparent to or compatible with a CMOS process flow, meaning the buried layer module can be performed as part of a CMOS formation process without disrupting or interrupting the CMOS formation process.

A step 304 of method 300 is to deposit an electrically insulating material in the trench after forming the buried layer. As an example, the electrically insulating material, can be similar to electrically insulating material 133 in FIG. 2. Step 304 and step 302 are referred to herein as an isolation module. The isolation module is also transparent to or compatible with a CMOS process flow, meaning the isolation module can be performed as part of a CMOS formation process without disrupting or interrupting the CMOS, formation process.

A step 305 of method 300 is to form a collector region having a second conductivity type in the semiconductor region of the first kind such that the collector region is electrically coupled to the buried layer. Accordingly, the collector region forms a contact to the buried layer. As an example, the collector region can be similar to collector region 150 in FIG. 2. Where the semiconductor component comprises a BiCMOS semiconductor component, step 305 can be used to simultaneously form similar buried layer contact regions for other bipolar or CMOS devices, where appropriate.

A step 306 of method 300 is to form an epitaxial base layer or layers above the semiconductor substrate. As an example, such as when the semiconductor component is an HBT, the epitaxial layers can be similar to silicon epitaxial layers 201 and 203 and silicon-germanium epitaxial layer 202 in FIG. 2.

A step 307 of method 300 is to form a dielectric layer over the epitaxial base layers. As an example, the dielectric layer can be deposited and patterned into a configuration similar to dielectric layer 206 in FIG. 2.

A step 308 of method 300 is to form an emitter having the second conductivity type over the semiconductor region of the first kind. As an example, the emitter can be similar to emitter 208 in FIG. 2. Step 308 can comprise depositing and patterning a polysilicon layer. Where the semiconductor component comprises a BiCMOS semiconductor component, step 308 can be used where appropriate to simultaneously form similar doped polysilicon regions for other semiconductor and/or integrated devices, such as bipolar or CMOS devices, resistors, or the like. During step 308, a portion of a dopant used to form the emitter may diffuse into an adjacent region of the semiconductor component, such as the epitaxial layer or layers formed in step 306 and/or the semiconductor substrate. An example of the portion of the dopant is emitter diffusion 205 in FIG. 2.

A step 309 of method 300 is to form a base structure having the first conductivity type over the semiconductor region of the first kind. As an example, the base structure can be similar to extrinsic base region 213 in FIG. 2. Step 309 or another step can further comprise patterning the base structure.

A step 310 of method 300 is to remove the portions of the dielectric layer formed previously in step 307 above the collector active regions. The portions of the dielectric layer may be removed using standard etch techniques.

A step 311 of method 300 is to form spacer structures around the emitter region and the base regions. As an example, the spacer structures can be similar to spacer structures 211 in FIG. 2. In one embodiment, source/drain implants, such as source/drain regions 215, can be formed as part of the CMOS process flow after the above steps have been completed.

Figure 4:
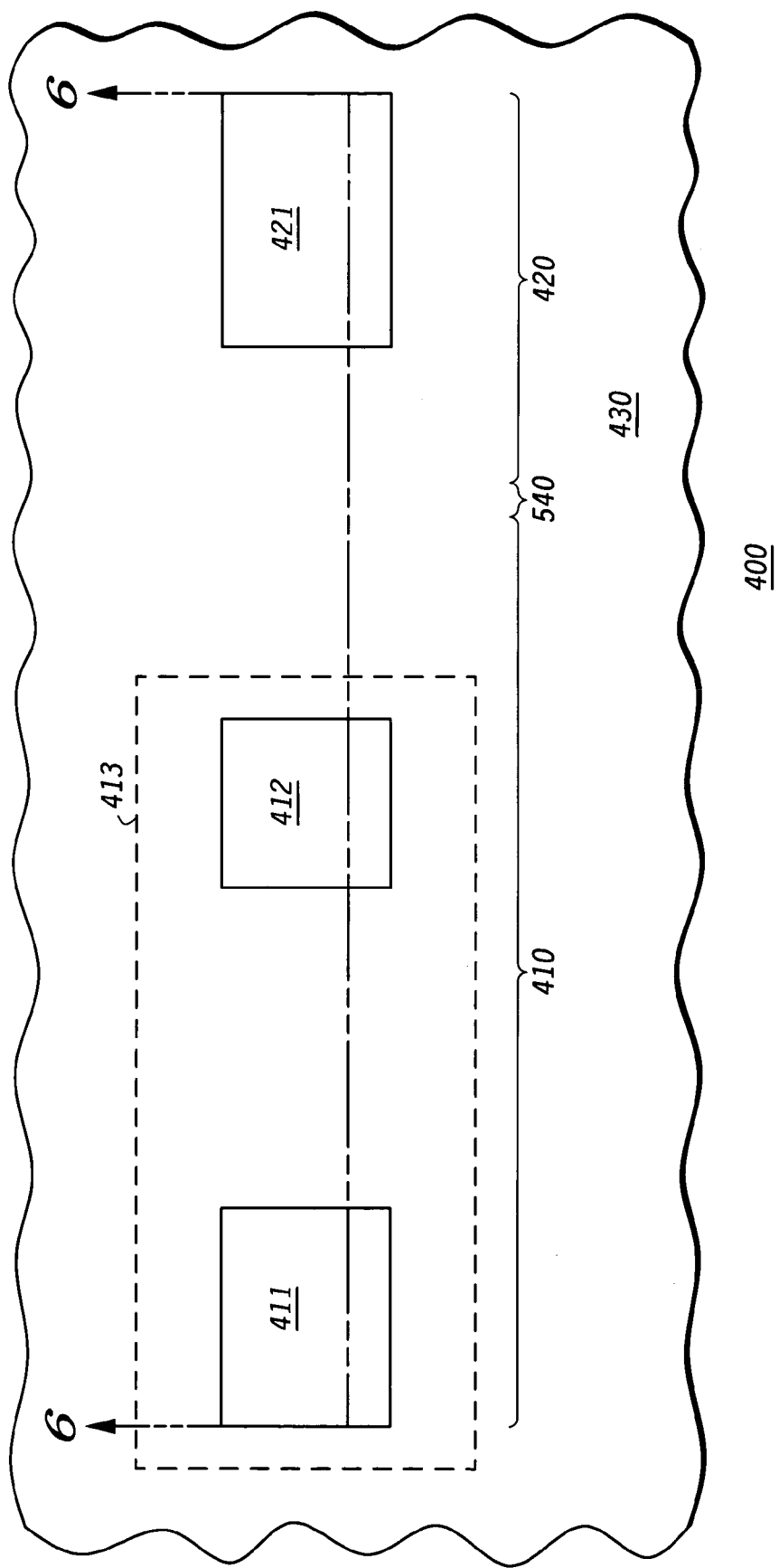
FIG. 4 is a top view of a portion of a different semiconductor component according to an embodiment of the invention.

FIG. 4 is a top view of a semiconductor component 400 according to an embodiment of the invention. Semiconductor component 400 comprises a bipolar semiconductor region 410 and a CMOS region 420 surrounded by a trench 430. In FIG. 4, bipolar semiconductor region 410 and CMOS region 420 are shown enclosed by dashed lines. In one embodiment, trench 430 can surround a plurality of bipolar semiconductor regions and a plurality of CMOS regions. Bipolar semiconductor region 410 comprises an active area 411 and an active area 412. CMOS region 420 comprises an active area 421. A region 413, also shown enclosed by a dashed line in FIG. 4, represents a region in which a buried layer is formed, as further described below.

Figure 5:
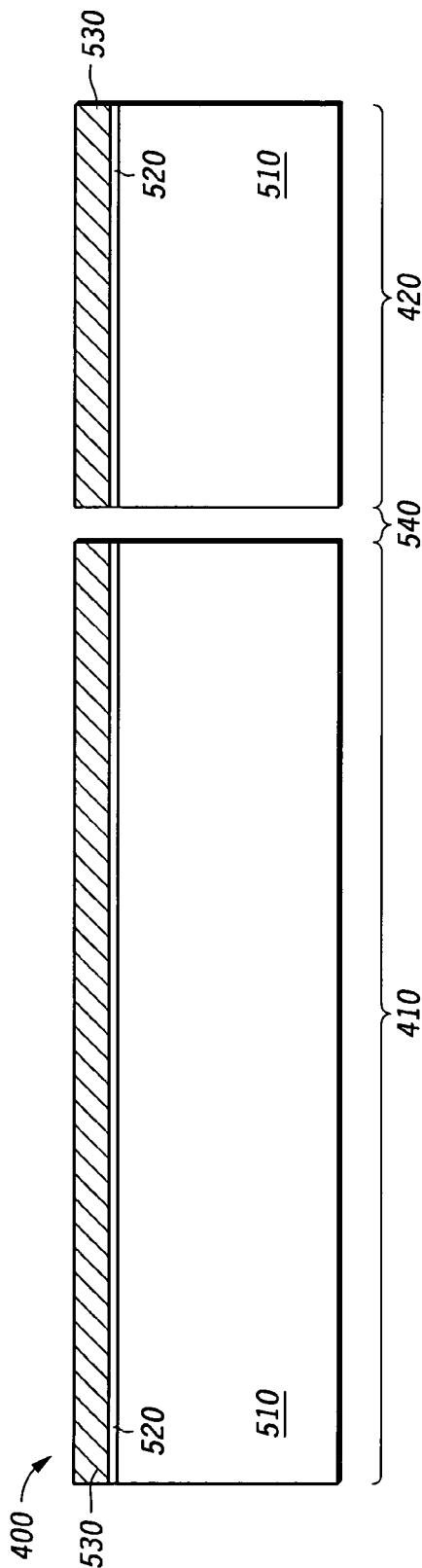
FIG. 5 is a cross-sectional view of the portion of the semiconductor component of FIG. 4 at a particular stage of a manufacturing process according to an embodiment of the invention.

FIG. 5 is a cross-sectional view of semiconductor component 400 at a particular stage of a manufacturing process according to an embodiment of the invention. As illustrated in FIG. 5, semiconductor component 400 comprises a semiconductor substrate 510, an oxide layer 520, and a nitride layer 530. A gap 540 represents a gap separating bipolar semiconductor region 410 and CMOS region 420, and is included in FIG. 5 and subsequent figures for illustrative purposes only.

Figure 6:
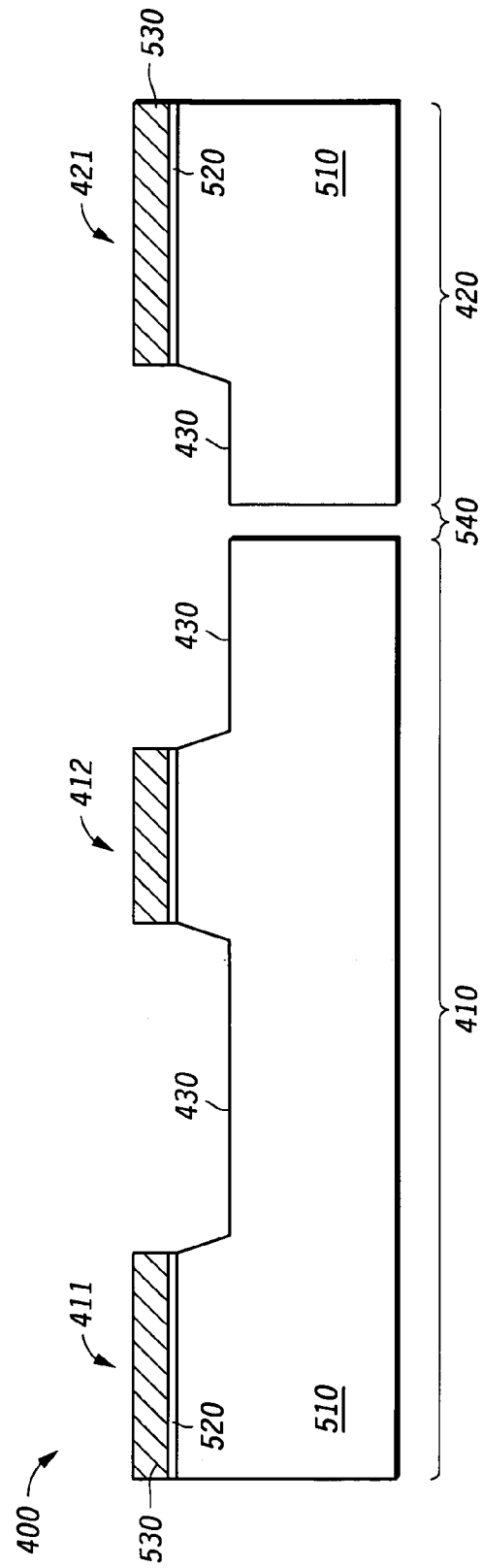
FIG. 6 is a cross-sectional view taken along a section line 6—6 in FIG. 4 of the portion of the semiconductor component of FIG. 4 at a later stage of the manufacturing process according to an embodiment of the invention.

FIG. 6 is a cross-sectional view of semiconductor component 400 at a later stage of the manufacturing process according to an embodiment of the invention. FIG. 6 is taken along a section line 6—6 in FIG. 4. As illustrated in FIG. 6, trench 430 is located both in bipolar semiconductor region 410 and in CMOS region 420. As stated above, trench 430 can be formed according to standard or known trench formation techniques.

Figure 7:
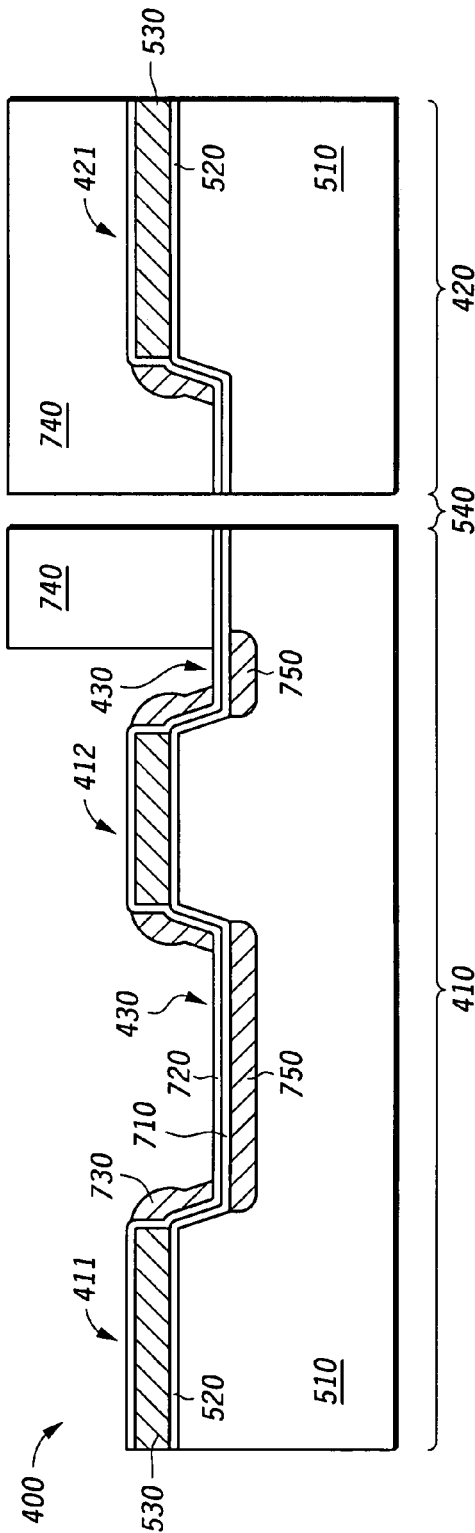
FIG. 7 is a cross-sectional view of the portion of the semiconductor component of FIG. 6 at a still later stage of the manufacturing process according to an embodiment of the invention.

FIG. 7 is a cross-sectional view of semiconductor component 400 at a still later stage of the manufacturing process according to an embodiment of the invention. As illustrated in FIG. 7, semiconductor component 400 further comprises an oxide layer 710, a TEOS layer 720, and a nitride layer 730. As also illustrated in FIG. 7, an implant mask 740 has been provided over active region 421 and a portion of trench 430 in CMOS region 420. Implant mask 740 has also been provided over a portion of trench 430 in bipolar semiconductor region 410. Placing implant mask 740 over a portion of a trench 430 in this fashion allows device resistances, breakdown voltages, and/or isolation characteristics to be fine tuned or customized for a particular application. As further illustrated in FIG. 7, a buried layer 750 has been formed in semiconductor substrate 510 underneath a portion of trench 430 in the bipolar semiconductor region 410. As an example, the portion of trench 430 in which buried layer 750 has been formed can be similar to region 413 in FIG. 4. The buried layer is at least partially contiguous with trench 430. No buried layer is located in CMOS region 420.

In one embodiment, a portion of nitride layer 730 can act as a spacer structure in a portion of trench 430. As an example, the spacer structure can comprise a silicon nitride layer over a thin TEOS layer, which also serves as an implant screen layer over the bottom of trench 430. The spacer structure may be used to mask the sidewalls of trench 430 where the sidewalls of trench 430 have a significant sidewall angle. If the sidewalls of trench 430 were not masked in this fashion, the formation of buried layer 750 could cause the buried layer implant to penetrate the trench sidewalls. Doped trench sidewalls could degrade the collector-base breakdown voltage and increase the parasitic collector-base capacitance, thus degrading overall device performance.

Figure 8:
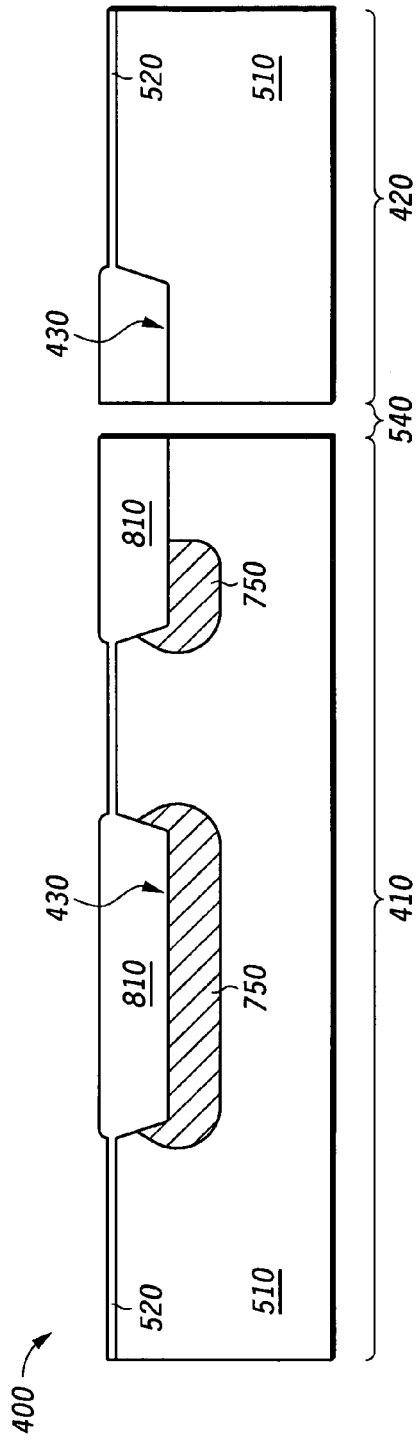
FIG. 8 is a cross-sectional view of the portion of the semiconductor component of FIG. 6 at a subsequent stage of the manufacturing process according to an embodiment of the invention.

FIG. 8 is a cross-sectional view of semiconductor component 400 at a subsequent stage of the manufacturing process according to an embodiment of the invention. As illustrated in FIG. 8, an electrically insulating material, such as TEOS, for example, has been placed in trench 430, and semiconductor component 400 has been planarized and buried layer 750 has been diffused. Planarization and diffusion techniques known in the art can be used to accomplish these results. Manufacturing of semiconductor component 400 proceeds from the point illustrated in FIG. 8 according to standard or known processes until all bipolar and CMOS devices are formed.

Figure 9:
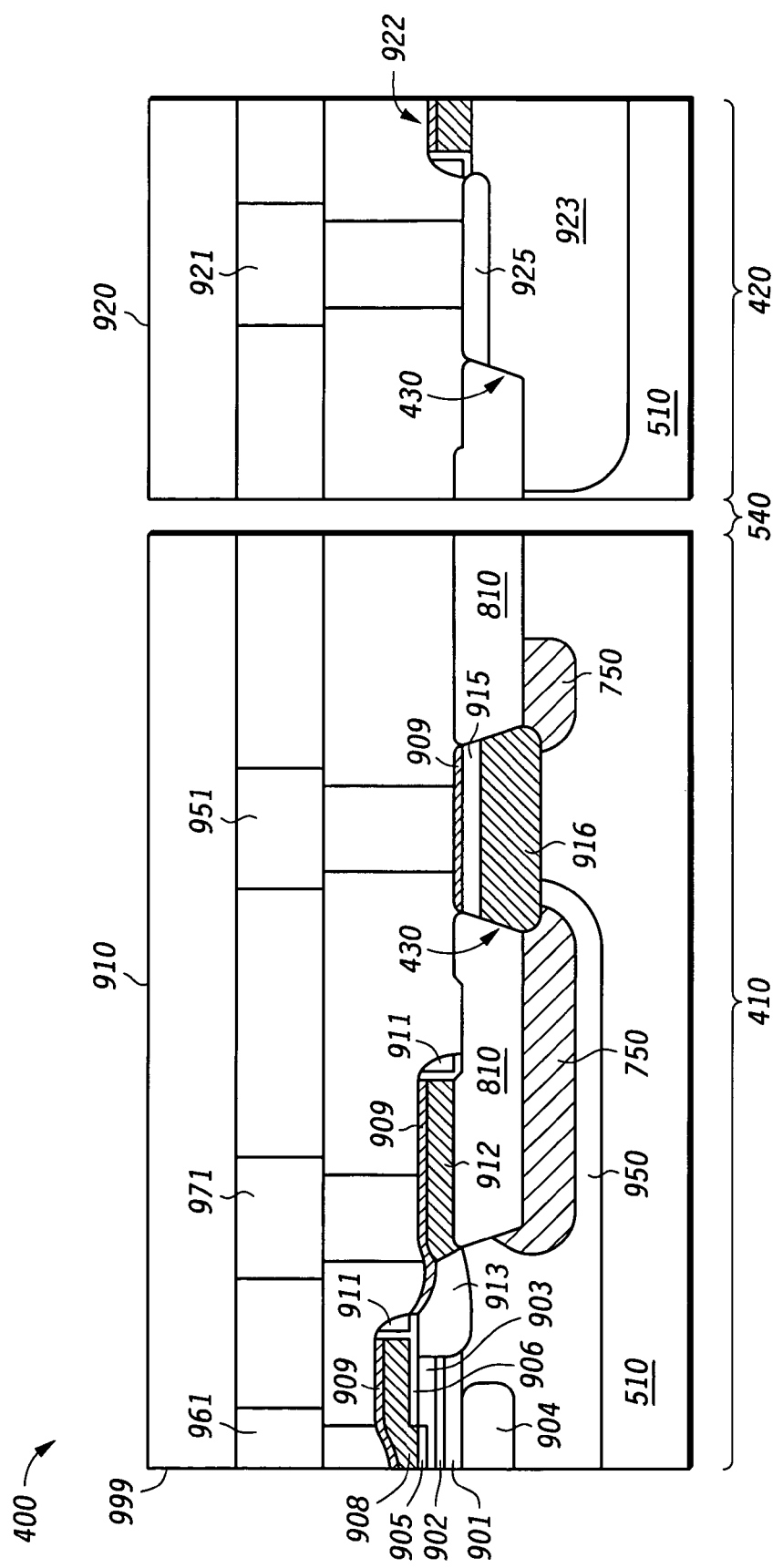
FIG. 9 is a cross-sectional view of the portion of the semiconductor component of FIG. 6 at a further stage of the manufacturing process according to an embodiment of the invention.

FIG. 9 is a cross-sectional view of semiconductor component 400 at a further stage of the manufacturing process according to an embodiment of the invention, and shows an HBT device 910 in bipolar semiconductor region 410 and a CMOS device 920 in CMOS region 420. As illustrated in FIG. 9, buried layer 750 is located underneath portions of trench 430 in bipolar semiconductor region 410, but not in CMOS region 420.

The completed HBT device illustrated in bipolar semiconductor region 410 of FIG. 9 is similar to semiconductor device 101 illustrated in FIG. 2. Only a portion of the completed HBT device is shown in FIG. 9. In the illustrated embodiment, HBT device 910 is symmetric about a line 999 representing the left edge of bipolar semiconductor region 410. HBT device 910 comprises an un-doped silicon epitaxial layer 901 and a silicon epitaxial layer 903, a silicon-germanium epitaxial layer 902, a selectively implanted collector region 904, an emitter diffusion 905 located in silicon epitaxial layer 903, a dielectric layer 906, an emitter 908, silicide layers 909, spacer structures 911, a base contact 912, and an extrinsic base region 913. HBT device 910 further comprises source/drain implant 915, resistor implant 916, and a collector region 950. Source/drain implant 915 and resistor implant 916 together form a contact to buried layer 750. HBT device 910 still further comprises a collector electrode 951, an emitter electrode 961, and a base electrode 971. As first described above, buried layer 750 lowers a lateral component 241 of $R_{cx}$ in HBT device 910, thus significantly increasing the performance of HBT device 910.

CMOS device 920, only a portion of which is illustrated in FIG. 9, comprises a source/drain region 925, a gate region 922, a well 923, and a source/drain electrode 925, manufactured according to standard or known techniques. It will be understood that semiconductor component 400 can further comprise additional bipolar semiconductor regions similar to bipolar semiconductor region 410, and/or additional CMOS regions similar to CMOS region 420.

Although the invention has been described with reference to specific embodiments, it will be understood by those skilled in the art that various changes may be made without departing from the spirit or scope of the invention. Various examples of such changes have been given in the foregoing description. As a specific example, although the invention has been described in connection with an HBT, the invention could also be used in connection with devices of other kinds. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing a semiconductor component, the method comprising:
   providing a semiconductor substrate having a surface and a first conductivity type;
   forming a trench in the surface of the semiconductor substrate to define a plurality of active areas separated from each other by the trench;
   forming a spacer structure in the trench;
   forming a buried layer in the semiconductor substrate underneath a portion of the trench, wherein the buried layer has a second conductivity type and is at least partially contiguous with the trench;
   after forming the buried layer:
      depositing an electrically insulating material in the trench; and
      removing the spacer structure;
   forming a collector region having the second conductivity type in one of the plurality of active areas;
   forming a base structure having the first conductivity type over the one of the plurality of active areas; and
   forming an emitter region having the second conductivity type over the one of the plurality of active areas,
   wherein:
      the collector region forms a contact to the buried layer.

2. The method of claim 1 wherein:
   the collector region has a first resistivity;
   the buried layer has a second resistivity; and
   the first resistivity is greater than the second resistivity.

3. The method of claim 1 wherein:
   forming the buried layer comprises:
      implanting a dopant having the second conductivity type through the trench.

4. The method of claim 3 wherein:
   forming the buried layer further comprises:
      annealing the dopant after implanting the dopant and before filling the trench.

5. The method of claim 1 wherein:
   forming the buried layer comprises:
      self-aligning the buried layer to the trench.

6. The method of claim 1 wherein:
   the semiconductor substrate comprises a semiconductor region of a first kind and a semiconductor region of a second kind;
   the method further comprises forming an implant mask over the semiconductor region of the second kind before forming the buried layer; and
   forming the buried layer further comprises:
      forming the buried layer underneath at least a portion of the trench in semiconductor region of the first kind.

7. The method of claim 6 wherein:
   the semiconductor region of the first kind comprises a bipolar semiconductor region; and
   the semiconductor region of the second kind comprises a CMOS region.

8. The method of claim 1 wherein:
   manufacturing the semiconductor component comprises:
      manufacturing the one of the plurality of active areas to be symmetric about a vertical line drawn through a middle of the emitter region.

9. A semiconductor component formed by the method of claim 1.

10. A method of manufacturing a semiconductor component, the method comprising:
    providing a semiconductor substrate having a surface and a first conductivity type, where the semiconductor substrate comprises a plurality of semiconductor regions of a first kind and a plurality of semiconductor regions of a second kind;
    forming a trench in the surface of the semiconductor substrate to define a plurality of active areas separated from each other by the trench;
    performing a buried layer module comprising:
       forming a plurality of spacer structures in the trench;
       forming an implant mask over the plurality of semiconductor regions of the second kind; and forming a plurality of buried layers, each one of the plurality of buried layers located underneath at least a portion of the trench in the plurality of semiconductor regions of the first kind, where the plurality of buried layers have a second conductivity type, are at least partially contiguous with the trench, and one of the plurality of spacer structures is used to self-align one of the plurality of buried layers to the trench;

after forming the plurality of buried layers, depositing an electrically insulating material in the trench;

forming a collector region having the second conductivity type in each of the plurality of semiconductor regions of the first kind; and forming an emitter region having the second conductivity type over each of the plurality of semiconductor regions of the first kind, wherein:
the collector region in each one of the plurality of semiconductor regions of the first kind forms a contact to the buried layer in the one of the plurality of semiconductor regions of the first kind.

11. The method of claim 10 further comprising:
removing the plurality of spacer structures after forming the plurality of buried layers.

12. The method of claim 10 further comprising:
forming a base region having the second conductivity type in the plurality of semiconductor regions of the first kind.

13. The method of claim 12 wherein:
forming the base region further comprises:
forming a contact in the base region; and
the contact in the base region is above at least a portion of the trench.

14. The method of claim 10 wherein:
the collector region has a first resistivity;
the plurality of buried layers have a second resistivity; and
the first resistivity is greater than the second resistivity.

15. The method of claim 10 wherein:
forming the plurality of buried layers comprises:
implanting a dopant having the second conductivity type through the trench.

16. The method of claim 15 wherein:
forming the plurality of buried layers further comprises:
annealing the dopant after implanting the dopant and before filling the trench.

17. The method of claim 10 wherein:
manufacturing the semiconductor component comprises:
manufacturing the plurality of semiconductor regions of the first kind to be symmetric about a vertical line drawn through a middle of the emitter region.

18. The method of claim 10 wherein:
the buried layer module is compatible with a CMOS process flow.

19. A method of manufacturing a semiconductor component, the method comprising:
providing a semiconductor substrate having a surface and a first conductivity type, where the semiconductor substrate comprises a plurality of bipolar semiconductor regions and a plurality of CMOS regions;

forming a trench in the surface of the semiconductor substrate in the plurality of bipolar semiconductor regions and in the plurality of CMOS regions to define a plurality of active areas separated from each other by the trench;

forming a buried layer in the semiconductor substrate underneath a portion of the trench in the plurality of bipolar semiconductor regions, where the buried layer has a second conductivity type and is at least partially contiguous with the trench;

after forming the buried layer, depositing an electrically insulating material in the trench;

forming a collector region having the second conductivity type in each one of the plurality of bipolar semiconductor regions;

forming a base structure having the first conductivity type over each one of the plurality of bipolar semiconductor regions;

forming an emitter having the second conductivity type over each one of the plurality of bipolar semiconductor regions;

forming source/drain regions over each one of the plurality of CMOS regions; and forming a gate region over each one of the plurality of CMOS regions, wherein:
the collector region forms a contact to the buried layer; and
forming the collector region occurs simultaneously with forming the source/drain regions.

20. The method of claim 19 wherein:
the collector region has a first resistivity;
the buried layer has a second resistivity; and
the first resistivity is greater than the second resistivity.

21. A semiconductor component formed by the method of claim 19.

* * * * *